(12) United States Patent
Chang

(10) Patent No.: US 7,551,325 B2
(45) Date of Patent: Jun. 23, 2009

(54) MULTIFUNCTIONAL APPARATUS

(75) Inventor: Deuk-hwan Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 973 days.

(21) Appl. No.: 10/979,196

(22) Filed: Nov. 3, 2004

(65) Prior Publication Data

US 2005/0106917 A1 May 19, 2005

(30) Foreign Application Priority Data

Nov. 19, 2003 (KR) .................. 10-2003-0082345

(51) Int. Cl.
*H04N 1/21* (2006.01)
*H04N 1/23* (2006.01)
*H04N 1/04* (2006.01)
(52) U.S. Cl. ........................... 358/296; 358/474
(58) Field of Classification Search ......... 358/1.9–3.32; 439/289
See application file for complete search history.

(56) References Cited

U.S. PATENT DOCUMENTS

2003/0170036 A1* 9/2003 Mochizuki et al. ............ 399/16
2004/0238199 A1* 12/2004 Yamanaka et al. ......... 174/68.1

FOREIGN PATENT DOCUMENTS

| JP | 05-204058 | 8/1993 |
| JP | 05-297164 | 11/1993 |
| JP | 05-323697 | 12/1993 |
| JP | 2001-250611 | 9/2001 |
| JP | 2003-029930 | 1/2003 |
| KR | 1998-031747 | 8/1998 |

* cited by examiner

*Primary Examiner*—Douglas Q Tran
(74) *Attorney, Agent, or Firm*—Roylance, Abrams, Berdo & Goodman, L.L.P.

(57) ABSTRACT

Provided is a multifunctional apparatus, which includes a main body, a cover unit, which covers a top of the main body, a scanning unit cover, which is combined with the top of the cover unit and on which an operating panel is formed, an operating panel circuit board, which is installed on and electrically connected to a bottom of the operating panel, and a main circuit board, which is installed inside the main body. The operating panel circuit board is electrically connected to the main circuit board when the scanning unit cover is closed, and the operating panel circuit board is electrically isolated from the main circuit board when the scanning unit cover is opened.

5 Claims, 4 Drawing Sheets

US 7,551,325 B2

MULTIFUNCTIONAL APPARATUS

PRIORITY

This application claims the benefit under 35 U.S.C. §119(a) of Korean Patent Application No. 2003-82345, filed on Nov. 19, 2003 in the Korean Intellectual Property Office, the entire disclosure of which is incorporated herein by reference.

BACKGROUND OF THE INVENTION

1. Field of the Invention

The present invention relates to a multifunctional apparatus. More particularly, the present invention relates to a compact multifunctional apparatus, which has an operating panel formed on a scanning unit cover and improves a structure of an electrical connection between an operating panel circuit board and a main circuit board disposed thereunder.

2. Description of the Related Art

Generally, a multifunctional apparatus is an apparatus which combines several office automation (OA) apparatuses, such as a printer, a scanner, and a facsimile.

Since the multifunctional apparatus typically includes an image scanning unit and a printing unit, it can scan an image recorded on a document and print it on a sheet of paper or receive a printing data from an external computer and print it on the sheet of paper.

In a conventional multifunctional apparatus, the image scanning unit is disposed over the printing unit. In particular, a compact multifunctional apparatus includes a scanning unit cover that covers a document path. One side of the scanning unit cover is hinge-jointed to a main body of the multifunctional apparatus so as to enable an easy maintenance operation when a paper jam occurs in the document path. Also, an operating panel of the multifunctional apparatus is preferably disposed on the scanning cover unit.

Therefore, in the main body of the multifunctional apparatus, an operating panel circuit board, which supplies power or transfers control signals to the image scanning unit and the operating panel, is separated from a main circuit board, which receives power from an external power source. Also, the operating panel circuit board can be selectively electrically connected to the main circuit board by wires disposed therebetween.

FIG. 1 is a perspective view of a conventional compact multifunctional apparatus. FIG. 2 is a perspective view of a portion of a main body of the apparatus shown in FIG. 1 when a scanning unit cover is opened to show a connection structure between circuit boards.

Referring to FIGS. 1 and 2, a multifunctional apparatus 1 includes a main body 10 and a scanning unit cover 50 that covers a top part of the main body 10. A document supply support 20 on which documents are loaded is formed between the main body 10 and the scanning unit 50. A paper supply support 30 on which sheets of paper are loaded is disposed below the document supply unit 20 to supply the sheets of paper to the main body 10. The document supply support 20 and the paper supply support 30 are inclined with respect to the rear side of the multifunctional apparatus 1, and a paper and document discharge support 40 is installed on the opposite side of the document and paper supply supports 20 and 30. Scanned documents or printed sheets of paper are stacked on the discharge support 40 together.

One side of the scanning unit cover 50 is rotatably hinge-jointed to the main body 10 of the multifunctional apparatus 1. An operating panel 60 is formed on the scanning unit cover 50, and an operating panel circuit board (not shown) is attached to a bottom of the operating panel 60. The operating panel circuit board is electrically connected to the operating panel 60 to transfer signals or supply power to the operating panel 60 or receive signals from the operating panel 60.

A main circuit board 11 is disposed at a bottom part of the multifunctional apparatus 1 and electrically connected to devices of a printing unit. The main circuit board 11 is connected to the operating panel circuit board by a plurality of conducting wires 13. The conducting wires 13 are relatively long and pass through an opening 12a of a cover unit 12, which is preferably formed by injection molding including the document supply support 20. An iron core 14 is installed around the conducting wires 130 to prevent noise interference, and a tube (not shown) may be additionally installed to protect the conducting wires 13.

The foregoing connection structure of the circuit board disadvantageously requires the iron core 14 to prevent noise interference caused by the long conducting wires 13, and also the conducting wires 13 can be cut off by components inside the multifunctional apparatus 1 when the scanning unit cover 50 is opened and closed.

Also, in the conventional compact multifunctional apparatus 1, when the scanning unit cover 50 to which the operating panel 60 is attached is opened, since the operating panel circuit board remains electrically charged, a user may accidentally push buttons of the operating panel 60, thus operating the multifunctional apparatus 1 unintentionally.

SUMMARY OF THE INVENTION

The present invention provides a multifunctional apparatus with a compact connection structure, in which conducting wires between a main circuit board and an operating panel circuit board are shortened.

The present invention also provides a multifunctional apparatus, which cuts off a power source connected to an operating panel whenever a scanning unit cover to which the operating panel is attached is opened.

According to an aspect of the present invention, there is provided a multifunctional apparatus comprising a main body, a cover unit, which covers a top of the main body, a scanning unit cover, which is combined with the top of the cover unit and on which an operating panel is formed, an operating panel circuit board, which is installed on and electrically connected to a bottom of the operating panel, and a main circuit board, which is installed inside the main body. The operating panel circuit board is electrically connected to the main circuit board when the scanning unit cover is closed, and the operating panel circuit board is electrically isolated from the main circuit board when the scanning unit cover is opened.

The multifunctional apparatus may further include a plurality of contacts, which are formed on a bottom of the operating panel circuit board, a plurality of first conducting wires, upper portions of which are disposed beneath the contacts to correspond to the contacts and lower portions of which protrude downward from a bottom of the scanning unit cover, a connector, which is connected to ends of a plurality of third conducting wires installed in the main circuit board, and a plurality of second conducting wires, which are formed at the cover unit, upper portions of which correspond to the first conducting wires, and lower portions of which are leads connected to the connector.

The upper portions of the first conducting wires may be elastically connected to the contacts. The lower portions of the first conducting wires, the upper portions of the second conducting wires, or both of them may be elastically formed.

The cover unit in which the second conducting wires are installed may include a concave portion with a predetermined depth.

BRIEF DESCRIPTION OF THE DRAWINGS

The above features and advantages of the present invention will become more apparent by describing in detail exemplary embodiments thereof with reference to the attached drawings in which.

Throughout the drawings, it should be understood that like reference numbers refer to like features and structures.

DETAILED DESCRIPTION OF THE EXEMPLARY EMBODIMENTS

The present invention will now be described more filly with reference to the accompanying drawings, in which exemplary embodiments of the invention are shown.

Figure 3:
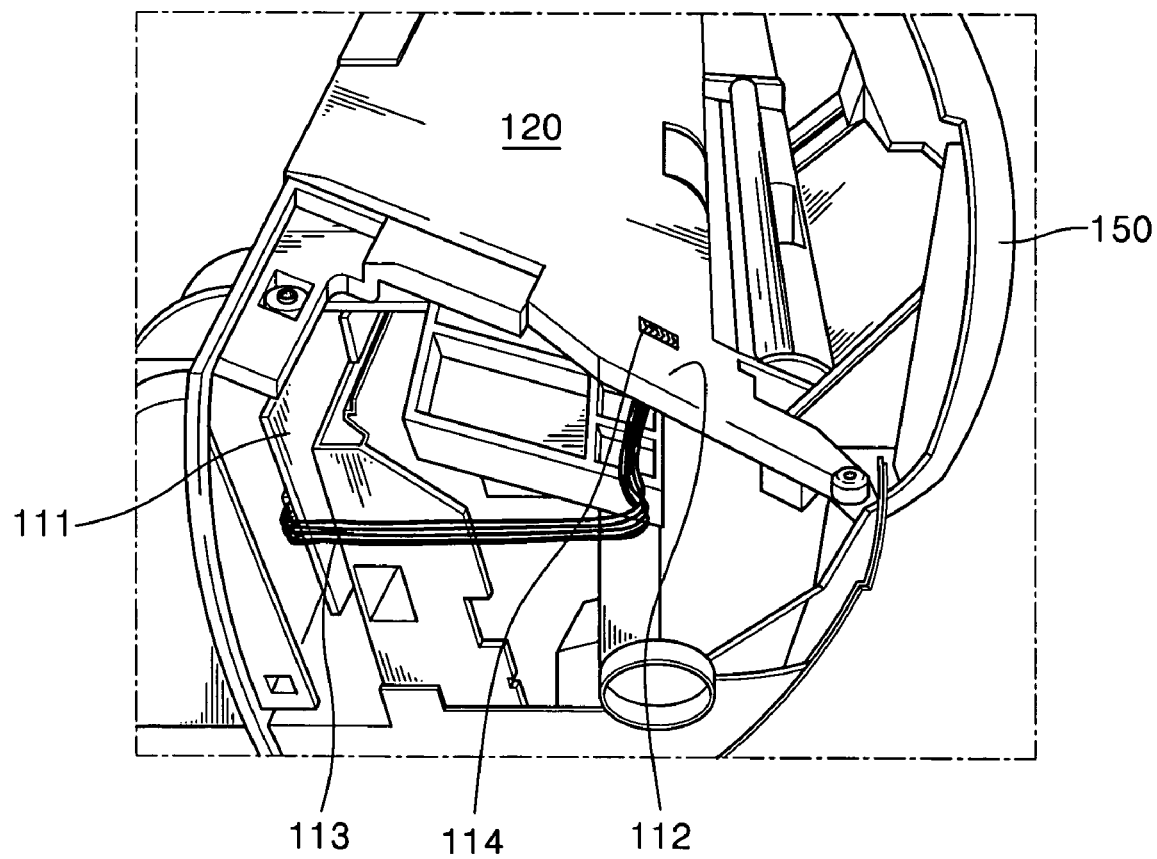
FIG. 3 is a perspective view of a portion of a multifunctional apparatus according to an embodiment of the present invention, to show a connection structure between circuit boards.
Figure 4:
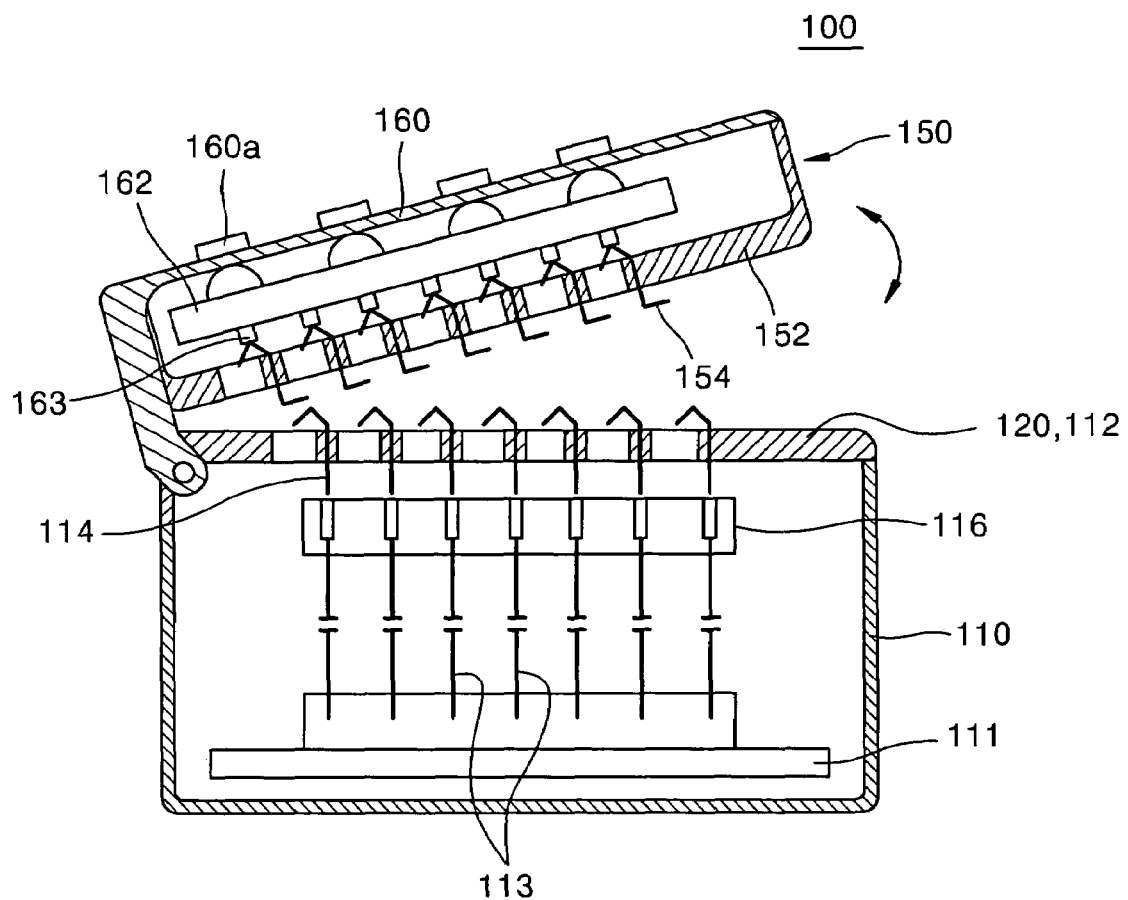
FIG. 4 is a cross-sectional view of the connection structure shown in FIG. 3.

FIG. 3 is a perspective view of a portion of a multifunctional apparatus according to an embodiment of the present invention, to show a connection structure between circuit boards, and FIG. 4 is a cross-sectional view of the connection structure shown in FIG. 3.

Figure 1:
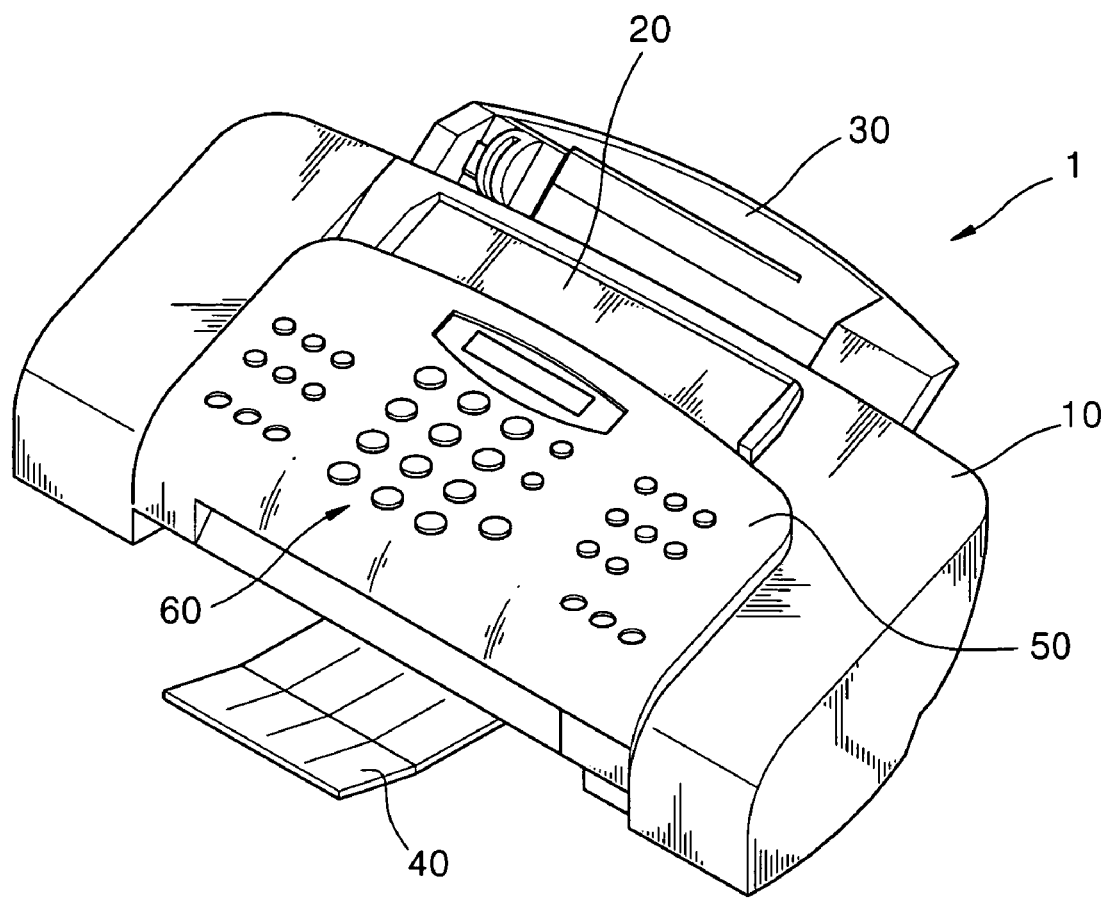
FIG. 1 is a perspective view of a conventional compact multifunctional apparatus.
Figure 2:
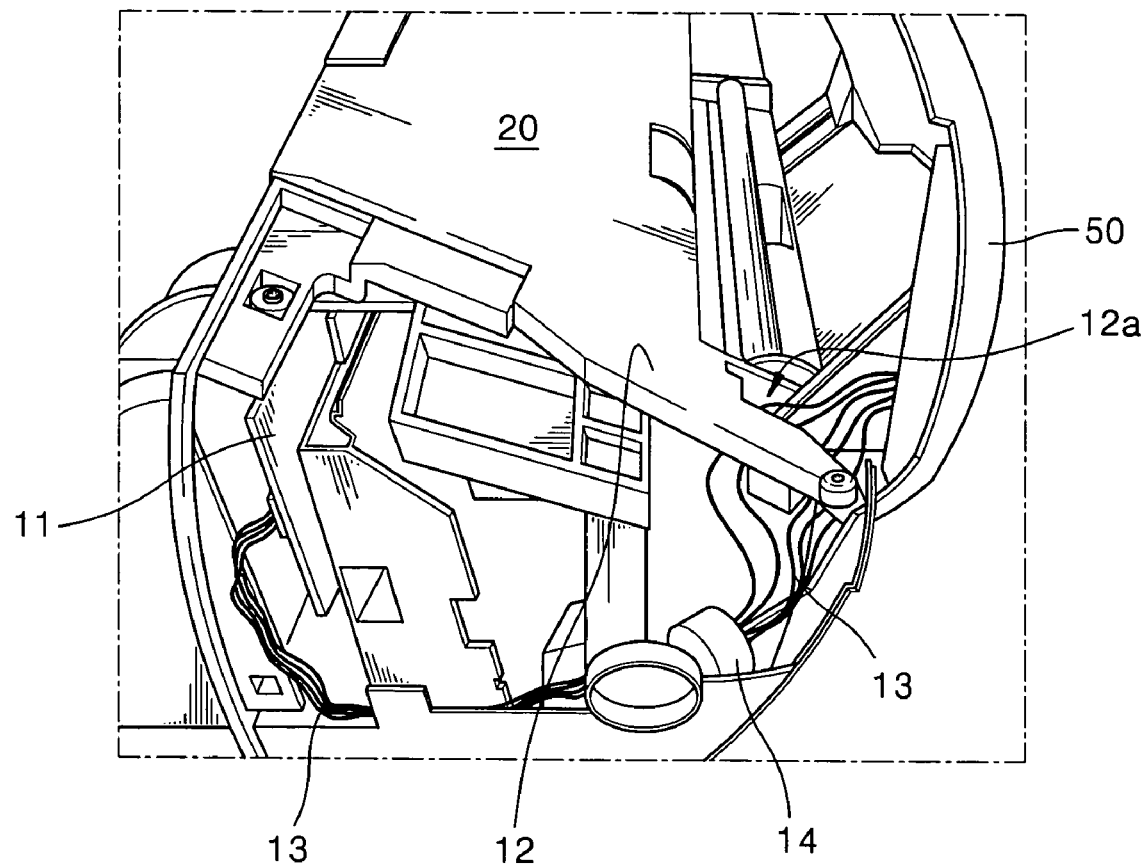
FIG. 2 is a perspective view of a portion of a main body of the apparatus shown in FIG. 1 when a scanning unit cover is opened, to show a connection structure between circuit boards.

Referring to FIGS. 3 and 4, a multifunctional apparatus 100 includes a main body 110 and a scanning unit cover 150 that covers a top of the main body 110. A document supply support 120 on which documents are loaded is formed between the main body 110 and the scanning unit cover 150. A paper supply support (30 of FIG. 1) on which sheets of paper are loaded is disposed below the document supply support 120 to supply the sheets of paper to the main body 110. The document supply support 120 and the paper supply support 30 are inclined with respect to the rear side of the multifunctional apparatus 100, and a paper and document discharge support (40 of FIG. 1) is installed on the opposite side of the document and paper supply supports 120 and 30. The document supply support 120 extends and forms a cover unit 112 that covers the main body 110.

One side of the scanning unit cover 150 is rotatably hinge-jointed to the main body 110 of the multifunctional apparatus 100. An operating panel 160 is installed on the scanning unit cover 150, and an operating panel circuit board 162 is attached to a bottom of the operating panel 160. When the operating panel circuit board 162 is electrically connected to the operating panel 160, it transfers signals or supplies power to the operating panel 160 or receives signals from the operating panel 160. A cover frame 152 is installed below the operating panel circuit board 162 so that the operating panel circuit board 162 is fixed to the bottom of the operating panel 160.

Also, a main circuit board 111 is disposed at a bottom part of the multifunctional apparatus 100 and electrically connected to devices of a printing unit. The main circuit board 111 is connected to an external power source.

A plurality of contacts 163 are exposedly formed on a bottom of the operating panel circuit board 162. The contacts 163 can be defined as areas that are not covered by an epoxy resin at the bottom of the operating panel circuit board 162.

A plurality of first conducting wires 154 are installed at the cover frame 152 and correspond to the contacts 163 of the operating panel circuit board 162. Upper portions of the first conducting wires 154 protrude and are connected to the corresponding contacts 163, and lower portions thereof protrude to a predetermined length outside the cover frame 152. One end of the upper portions of the first conducting wires 154 are fixed to the cover frame 152, and the other ends thereof are separated from the cover frame 152 such that the first conducting wires 154 have a predetermined elasticity. Thus, when the first conducting wires 154 contact the contacts 163, the other ends of the upper portions move downward and then have restoring forces upward.

When the cover frame 152 is installed on the operating panel 160, the upper portions of the first conducting wires 154 are electrically connected to the contacts 163.

A plurality of second conducting wires 114 are formed at the cover unit 112, which extends from the document supply support 120, and correspond to the first conducting wires 154. Upper portions of the second conducting wires 114 are electrically connected to the lower portions of the first conducting wires 154. That is, when the scanning unit cover 150, hinge-jointed to the main body 110, is opened, the first conducting wires 154 are electrically isolated from the second conducting wires 114, and when the scanning unit cover 150 is closed, the first conducting wires 154 are electrically connected to the second conducting wires 114. The upper portions of the second conducting wires 114 can be elastically formed. Also, the lower portions of the first conducting wires 154 can be elastically formed. Lower portions of the second conducting wires 114 can be formed of leads to be easily connected to a connector 116, which will be described in further detail below.

Figure 5:
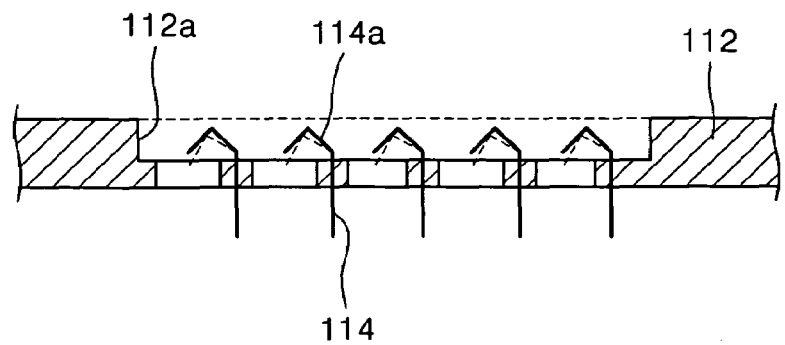
FIG. 5 is a cross-sectional view of a portion of a modified example of the connection structure shown in FIG. 4.

Referring to FIG. 5, which shows a portion of a modified example of the connection structure shown in FIG. 4, the cover unit 112, in which the upper portions 114a of the second conducting wires 114 are installed, can include a concave portion 112a with a predetermined depth in order to prevent a user's hand from contacting the second conducting wires 114. As illustrated with dotted lines in FIG. 5, when the upper portions 114a of the second conducting wires 114 contact the lower portions of the first conducting wires 154, ends of the upper portions 114a have elasticity and move downward and then have restoring forces upward.

Referring to FIGS. 3 and 4, a plurality of third conducting wires 113 are installed in the main circuit board 111 to connect the main circuit board 111 to the operating panel circuit board 162. The third conducting wires 113 have ends connected to the connector 116 and are installed to correspond to the second conducting wires 114. Thus, the connector 116 is fabricated so as to insert the leads of the second conducting wires 114 into the connector 116.

The functions of the electrical connection structure of the multifunctional apparatus 100 will now be described in detail with reference to the foregoing drawings.

Initially, to normally operate the multifunctional apparatus 100, the scanning unit cover 150 should be closed. If the scanning unit cover 150 is opened, the first conducting wires 154 are separated from the second conducting wires 114 and thus power is not supplied from the main circuit board 111 to the operating panel circuit board 162.

When the connector 116 to which the third conducting wires 113 of the main circuit board 111 are connected is connected to the leads of the second conducting wires 114 and an external power is supplied to the main circuit board 111, if the scanning unit cover 150 is closed, the first conducting wires 154 are connected to the second conducting wires 114. Thus, power is supplied and signals are transferred from the main circuit board 111 through the third conducting wires 113, the second conducting wires 114, and the first conducting wires 154 to the operating panel circuit board 162.

Thereafter, if buttons 160a of the operating panel 160 are pushed, the signals are transferred through the operating panel circuit board 162 to the main circuit board 111. Then, the main circuit board 111 controls the printing unit and the image scanning unit.

As described above, in the multifunctional apparatus according to embodiments of the present invention, conducting wires between the operating panel circuit board and the main circuit board are shortened. Thus, it is unnecessary to use an iron core for preventing noise interferences caused by long conducting wires or a tube for protecting conducting wires. As a result, the fabrication cost is reduced.

Also, since the conducting wires are disposed only under the connector, noise interference between the conducting wires and the scanning unit cover is eliminated. Thus, the conducting wires are not damaged when the scanning unit cover is opened and closed, and maintenance becomes easier because the conducting wires are not very complicated.

Further, as a power source is cut off from the operating panel whenever the scanning unit cover is opened, even if a user mistakenly pushes the buttons of the operating panel, the multifunctional apparatus does not operate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multifunctional apparatus comprising:
a main body;
a cover unit, which covers a top of the main body;
a scanning unit cover, which is combined with the top of the cover unit and on which an operating panel is formed;
an operating panel circuit board, which is installed on and electrically connected to a bottom of the operating panel; and
a main circuit board, which is installed inside the main body,
wherein the operating panel circuit board is electrically connected to the main circuit board when the scanning unit cover is closed, and the operating panel circuit board is electrically isolated from the main circuit board when the scanning unit cover is opened.

2. The apparatus of claim 1, further comprising:
a plurality of contacts, which are formed on a bottom of the operating panel circuit board;
a plurality of first conducting wires, upper portions of which are disposed beneath the contacts to correspond to the contacts and lower portions of which protrude downward from a bottom of the scanning unit cover;
a connector, which is connected to ends of a plurality of third conducting wires installed in the main circuit board; and
a plurality of second conducting wires, which are formed at the cover unit, upper portions of which correspond to the first conducting wires, and lower portions of which are leads connected to the connector.

3. The apparatus of claim 2, wherein the upper portions of the first conducting wires are elastically connected to the contacts.

4. The apparatus of claim 2, wherein the lower portions of the first conducting wires, the upper portions of the second conducting wires, or both of them are elastically formed.

5. The apparatus of claim 2, wherein the cover unit in which the second conducting wires are installed includes a concave portion with a predetermined depth.

* * * * *